United States Patent [19]

Hartman

[11] 4,357,415
[45] Nov. 2, 1982

[54] METHOD OF MAKING A SOLID-STATE COLOR IMAGING DEVICE HAVING A COLOR FILTER ARRAY USING A PHOTOCROSSLINKABLE BARRIER

[75] Inventor: Susan E. Hartman, Rochester, N.Y.

[73] Assignee: Eastman Kodak Company, Rochester, N.Y.

[21] Appl. No.: 310,168

[22] Filed: Oct. 9, 1981

Related U.S. Application Data

[62] Division of Ser. No. 127,605, Mar. 6, 1980, Pat. No. 4,315,978.

[51] Int. Cl.³ ............................................. G03C 1/84
[52] U.S. Cl. ...................................... 430/293; 430/7; 430/321
[58] Field of Search ..................... 430/4, 7, 245, 293, 430/321, 570, 571

[56] References Cited

U.S. PATENT DOCUMENTS 3,284,208 11/1966 Land .
3,833,369 9/1974 Chiklis .
3,929,489 12/1979 Arcesi .

FOREIGN PATENT DOCUMENTS 1470059 4/1977 United Kingdom .

OTHER PUBLICATIONS

Friedman, *History of Color Photography*, American Photographic Pub. Co., 1944, Chapter 13.

*Primary Examiner*—Jack P. Brammer
*Attorney, Agent, or Firm*—John R. Everett

[57] ABSTRACT

A color filter array for a solid-state imaging device is disclosed. The color filter array is of the "wash-off" type wherein the individual filter elements are formed by dyeing tiny islands of a dyeable composition. As a barrier layer, the color filter array of the present disclosure uses a photocrosslinkable dye-impermeable polymer. The barrier is coated over a set of filter elements. A method of making the described solid-state device is also disclosed.

6 Claims, 14 Drawing Figures

METHOD OF MAKING A SOLID-STATE COLOR IMAGING DEVICE HAVING A COLOR FILTER ARRAY USING A PHOTOCROSSLINKABLE BARRIER

This is a division of application Ser. No. 127,605, filed Mar. 6, 1980, now U.S. Pat. No. 4,315,978.

FIELD OF THE INVENTION

The present invention relates to solid-state color imaging devices and to methods for making them. More particularly, the present invention relates to a color filter array for the device. The color filter array of the present invention is of the "wash-off" type as described below.

DESCRIPTION RELATIVE TO THE PRIOR ART

It is well-known that a "single site" color imaging device can be made by registering a color filter array with an array of panchromatically sensitive elements in a solid-state device. The solid-state imaging device is typically formed from a silicon wafer. The surface of the wafer is processed, using known methods, to produce a number of arrays of solid-state photosensitive areas sometimes called pixels. The color filter array is then registered with the surface. A single wafer might contain a number of devices. By proper selection of the color of the individual filter elements in the color filter array and by proper positioning of each filter element, a color image can be extracted from a single solid-state device.

In order to produce a color image, the color filter array must contain at least two sets of differently colored filter elements. Using known matrixing methods, an acceptable three-color image can be produced. For highest quality, however, at least three sets of differently colored elements are required. The colors of these sets in the array are most desirably the additive primaries, namely, red, green and blue.

Color filter arrays have been known for many years. In fact, many of the early methods of color photography operated by virtue of an additive color screen or filter array in registration with a suitable silver image. In these methods, a silver image is formed by imagewise-exposing a silver halide layer through the screen and then developing the layer. The resulting silver image, when viewed in proper registration through the same screen, produces a color reproduction of the original image.

In many respects, the requirements for the additive screen in these early methods are much less stringent than are the requirements for color filter arrays for a single-site solid-state color imager. For example, in a solid-state device, exact positioning of each element of the filter array is essential because, in order to process the signal coming from a device, the photosensitivity of each pixel must be known. Furthermore, if the filter element is not properly registered with the underlying pixel, unwanted exposure of the pixel can seriously degrade the quality of the color signal. As a result, each filter element must be in microregistration with an underlying pixel or pixels.

In the early additive color screen processes, exposure of the silver halide and viewing of the developed image usually took place through the same screen. This screen was maintained in contact with the silver halide or silver layer at all times. Thus, unlike the color filter array for a solid-state device, exact positioning of individual elements in the screen for a silver halide element is not critical because registration is automatic. In fact, random screens made of irregularly shaped filter elements are useful in these early processes.

For yet another reason, filter arrays for use with solid-state imagers have stringent requirements. It is desirable that the filter elements which are used in color filter arrays for solid-state color imaging devices have certain spatial relationships. These required relationships obviously exclude easily made random screens and generally exclude striped filters which are commonly used in additive screens for use with silver halide layers. (See U.S. Pat. No. 3,971,065 by Bayer issued July 20, 1976.)

To summarize, the individual filter elements for a color filter array in a solid-state imaging device are most preferably discrete elements, as opposed to stripes, and must be precisely sized and precisely positioned in the array. Furthermore, for any useful commercial device it is necessary that the individual filter elements be very small. In these commercially useful devices, an individual filter element must be less than about $1.0 \times 10^{-8}$ m$^2$.

One method which has been used to make color screens for silver halide and similar elements will be referred to as the "wash-off" method. (See Friedman, *History of Color Photography*, The American Photographic Pub Co, 1944, chapter 13, at page 154 et seq.) In this method, a layer of a radiation-sensitive composition is coated and then exposed in a pattern representing a set of filter elements, usually stripes, to crosslink or harden those areas. The remainder of the layer is then washed off, leaving hardened areas of the original composition. The hardened areas are dyed to produce colored elements and the process is repeated to produce additional sets of elements. It is known to provide a barrier layer, made from a dye-impermeable material, over each successive set of elements to eliminate substantially the problem of dye contamination or dye leaching when other sets of elements are subsequently dyed. One commonly used "wash-off" composition is a dichromated gelatin, and the barrier layer which is most commonly used is nitrocellulose. (See, for example, U.S. Pat. No. 3,284,208 by Land issued Nov. 8, 1966.)

STATEMENT OF THE PROBLEMS

I have found that, when applied to solid-state imaging devices, the wash-off process using a conventional dye-impermeable nitrocellulose layer presents serious problems. The first two sets of elements can be formed easily. A first set of islands is formed and dyed, the nitrocellulose layer is coated, and a second set of islands are formed and dyed. The problems begin when the second nitrocellulose layer is coated. Obviously, nitrocellulose must be coated in a solvent for nitrocellulose. This solvent attacks the previously coated nitrocellulose layer. Unfortunately, the second set of islands is on top of the first nitrocellulose layer. As the first nitrocellulose layer begins to dissolve and the solvent begins to undermine the second set of islands, the second set of islands begins to "float" on the now liquid first nitrocellulose layer. During the time the second set of islands is "floating", the islands can and do move out of position. It will be remembered that, while some movement may be tolerable for an additive color screen for a silver halide element, virtually any movement of the filter elements will seriously affect the usability of a color filter array for a solid-state imaging device. Further, it may be that the stripes used in the screen for silver halide elements are more positionstable during the "floating" period than the tiny islands. In any event, the floating becomes more of a problem as the size of the elements is decreased. The smaller the element, the less time it takes for the solvent to undermine the filter element and allow it to float. In the case of filter elements of the size necessary for a commercially useful solid-state imager, i.e., less than about $1.0 \times 10^{-8}$ m$^2$, filter-element "float" can be a serious problem.

A conventional barrier layer presents yet another problem in a color filter array for a solid-state imaging device. It will be readily appreciated that, in a three-color screen, the entire surface of the completed device will be coated with at least two nitrocellulose layers. For a silver halide element, this presents no real problem because the only remaining step is to coat the surface of the screen with a silver halide layer and the nitrocellulose layers do not interfere with this step. However, after a color filter array is formed on the surface of a solid-state device, electrical contacts must be made to the same surface of the device to what are called "bonding pad" areas. The nitrocellulose layers prevent the formation of good electrical contact.

SUMMARY OF THE INVENTION

I have now found that excellent color filter arrays of the type wherein each filter element is a dyed island are made by providing a photocrosslinked, dye-impermeable polymer as the barrier material. The dye-impermeable polymer is crosslinked by exposure to suitable radiation to become insoluble in the coating solvent. This eliminates the problems caused by filter element "float". Further, the photocrosslinkable, dye-impermeable polymer layer is exposed and developed in such a manner that the bonding pad areas are substantially free from the dye-impermeable polymer. Thus, electrical connection to the device is facilitated.

In one aspect of my invention, I provide a solid-state color imaging device comprising a support having a surface comprising solid-state radiation-sensitive elements and bonding pad areas. Superimposed on the radiation-sensitive elements, in microregistration, is a color filter array having at least three sets of filter elements. Each filter element of the color filter array is a dyed island of a dyeable composition having an area less than about $1.0 \times 10^{-8}$ m$^2$, preferably about $1.2 \times 10^{-10}$ m$^2$. The color filter array comprises:

a first set of filter elements on the surface of the device;

a second set of filter elements separated from the surface of the device by a layer of a crosslinked dye-impermeable polymer; and a third set of filter elements separated from the surface of the device by two layers of a crosslinked dye-impermeable polymer.

Further, the bonding pad areas are substantially free from the dye-impermeable polymer.

An important aspect of the present invention is the photocrosslinkable polymer which is capable of forming the dye-impermeable polymer layer between successive sets of filter elements. While any polymer can be used which meets the criteria which are set forth in the detailed description which follows, a particularly preferred class comprises photocrosslinkable polyester-ionomers. These preferred polyesters contain a sufficient amount of ionic groups to improve the adhesion of the polymer but an insufficient amount to render the polyester water-soluble.

The composition which is used to form the individual filter elements is selected from a wide variety of dyeable compositions. A particularly preferred composition comprises a diazo resin and a mordant for anionic dyes which is compatible with the resin. This composition is described in CONTINUOUS-TONE DYED DIAZO IMAGING ELEMENTS, Research Diclosure, Vol 169, item 16976, May, 1978. Research Disclosure is published by Industrial Opportunities Ltd, Homewell Havant Hampshire, P09 IEF, United Kingdom.

In another aspect of my invention, I provide a method of making the device described above. The method includes the steps of:

(1) forming a layer of a radiation-sensitive, dyeable composition on the surface of the device which comprises the solid-state radiation-sensitive elements;

(2) exposing and developing the radiation-sensitive, dyeable layer so as to form a set of islands superimposed on some of the solid-state radiation-sensitive elements, the islands having an area less than about $1.0 \times 10^{-8}$ m$^2$;

(3) dyeing these islands formed in the previous step by contacting them with a solution comprising a solvent and a dye, thereby forming a set of filter elements;

(4) overall coating the dyed islands and the remainder of the surface with a layer of a photocrosslinkable, dye-impermeable polymer;

(5) exposing the photocrosslinkable, dye-impermeable polymer layer so as to crosslink the polymer at least in those areas corresponding to the islands, leaving unexposed those areas corresponding to the bonding pad areas of the device;

(6) developing the photocrosslinkable, dye-impermeable polymer layer so as to remove the polymer from the bonding pad areas; and (7) repeating steps (1) through (6) and then (1) through (3) using a different exposure in each step (2) and a different dye in each step (3) so as to produce second and third sets of filter elements.

It is possible to expose the radiation-sensitive dyeable layer in step (2) to such an extent that any underlying photocrosslinkable, dye-impermeable layer is also exposed and crosslinked. The process of the invention will then be simplified to the extent that the separate exposure (step 5) and development (step 6) of each photocrosslinkable, dye-impermeable polymer layer are omitted.

DETAILED DESCRIPTION OF THE INVENTION

Figure 1A:
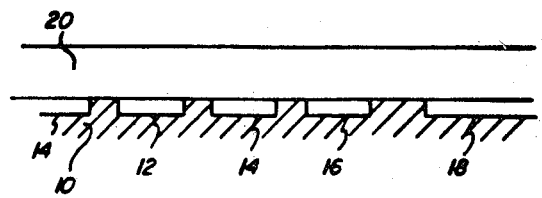
FIGS. 1a–1g are schematic representation of a device of the present invention, in cross-section, illustrating various stages during the preferred method of preparation.
Figure 1B:
Figure 1C:
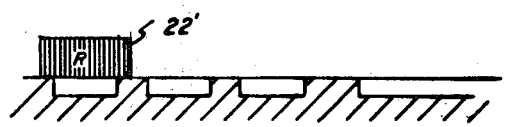

The photocrosslinkable, dye-impermeable polymer should be capable of forming a thin film over the surface of a solid-state device and over any filter elements which are on this surface. In a color filter array containing three sets of filter elements, the second and third sets of filter elements will be separated from the surface of the device by one and two layers of the crosslinkable polymer, respectively. The overall thickness of a color filter array for a solid-state imaging device should be less than about 10 microns. Therefore, the combined thickness of a filter element and two layers of the crosslinked polymer should be less than 10 microns. Because the filter elements are typically about 1.5 microns thick, the crosslinked, dye-impermeable polymer layers or layer portions optionally are up to about 3 microns in thickness. In practice, it has been found that, with the preferred radiation-sensitive polyester-ionomer polymers, an extremely thin layer of the polymer still provides an adequate dye barrier. Thicknesses on the order of about 2000 angstroms and preferably less than 1500 angstroms have been found to be particularly preferred. The thicknesses referred to relate to the thicknesses after the coating solvent has been removed from the coating composition.

The thickness of the dye-impermeable polymer layer is adjusted by means well-known in the art. Typically, these polymers are spin-coated. Thickness of the polymer layer is then adjusted by proper selection of the viscosity of the coating composition and by the rate of spinning. The 1500-angstrom layer of the preferred polyester-ionomer having an inherent viscosity of 0.25 is formed by coating a 2.5 weight percent solution of the polymer in 1,2-dichloromethane solution on a wafer spinning at 2200 rpm.

The dye-impermeable polymer must be photocrosslinkable so that it is crosslinked to become insoluble in the coating solution by exposure to suitable radiation. In preferred embodiments, the layer of polymer is exposed except in those areas corresponding to the bonding pads. The layer is then developed before the next set of filter elements is formed. In these embodiments, the resolution of the photocrosslinkable polymer is not critical because the bonding pad areas are relatively large. In other embodiments, for example, where the photocrosslinkable, dye-impermeable polymer is exposed during the exposure of the dyeable composition, the dye-impermeable polymer and the dyeable composition should have similar resolution. Typically, a resolution of about 2 microns is sufficient in these embodiments.

The dye-impermeable polymer must be "photocrosslinkable". By "photocrosslinkable" it is meant that the crosslinking or bridging between polymer molecules is formed by exposing the polymer to suitable radiation. In most polymers of this type, the crosslinking sites of photocrosslinkable polymers are activated by radiation in the ultraviolet portion of the spectrum. However, any polymer is considered photocrosslinkable for the purpose of the present invention if the crosslinking sites in the polymer are activated by any form of electromagnetic energy. The photocrosslinkable polymer should contain a sufficient weight percentage of units which provide crosslinking sites so that the polymer becomes insoluble in the coating solvent for the polymer when exposed to the activating radiation.

The photocrosslinkable polymer which is to form the barrier must be dye-impermeable. By "dye-impermeable" it is meant that the polymer does not allow the diffusion of dye to the underlying dyed islands or allow leaching of the dye from the islands. Of course, the dye-impermeable polymer must not itself by dyeable under the conditions used in the dyeing step. The polymer need only be dye-impermeable at that stage in the process where the coating is contacted with the dye solution. Where the polymer is crosslinked in all areas except the bonding pad areas, it is necessary only that the crosslinked polymer by dye-impermeable. In other embodiments where the polymer layer is crosslinked only in areas corresponding to filter elements, it is necessary that both the uncrosslinked and crosslinked polymer be dye-impermeable.

After the islands which are to be the individual filter elements are formed, they are dye generally by immersion in an aqueous dye solution. In these embodiments, the polymer which is to form the barrier optionally is made dye-impermeable by the incorporation of the polymer of a substantial proportion of hydrophobic repeating units. Photocrosslinkable polymers containing hydrophobic units are well-known in the lithographic arts. Useful polymers include poly[1,4-cyclohexylenebis(oxyethylene)3,3'(1,4-phenylene)diacrylate] such as described in U.S. Pat. No. 3,707,373 and the polymers described in U.S. Pat. Nos. 3,173,787, 2,956,878 and 3,782,938, and Research Disclosure, Vol 176, Item 17632, December, 1978.

The dyeable composition over which the photocrosslinkable, dye-impermeable polymer layer is coated is usually a hydrophilic composition. In order to improve the adhesion of the predominantly hydrophobic barrier polymer to the hydrophilic islands, as well as to the surface of the wafer, it is desirable to include a small proportion of hydrophilic units in the photocrosslinkable, dye-impermeable polymer. The proportion of hydrophilic units should be sufficient to improve the adhesion of the polymer but should be insufficient to cause the polymer to be water-permeable or dyeable. Useful hydrophilic monomers which can be copolymerized with hydrophobic monomers include dimethyl-5-sodiosulfo-1,3-benzene diacrylate, dimethyl-5-(4-sodiosulfophenoxy)-1,3-benzene dicarboxylate, dimethyl3,3'-iminodisulfonyldibenzoate and dimethyl-5-[N-(4-tolylsulfonyl)-N-potassiosulfamoyl-1,3-benzenedicarboxylate]. In preferred embodiments, less than 20 mole percent of these monomers should be included in the polymer; most preferably, the polymer should contain between 2.5 and 15 mole percent of these hydrophilic units.

A particularly preferred class of polymers which meets the above-described criteria are photocrosslinkable polyester-ionomers. Polyester-ionomers are characterized in that the polyester contains at least one aromatic dicarboxylic acid-derived repeating unit which contains an alkali metal sulfonate group or an iminodisulfonyl unit containing monovalent cations as imido nitrogen atom substituents. Photocrosslinkable polyester-ionomers preferably contain a dicarboxylic acid-derived repeating unit containing nonaromatic ethylenic unsaturation capable of providing crosslinking sites.

In particularly preferred forms, the polyesters contain at least three dicarboxylic acid-derived repeating units. One dicarboxylic acid-derived repeating unit is the photocrosslinking unit. This unit crosslinks with similar units on other polymer chains on exposure to activating radiation as defined previously. Another dicarboxylic acid-derived repeating unit is the hydrophobic unit. The third dicarboxylic acid-derived repeating unit is a unit comprising a sulfonate ionic group, i.e., a hydrophilic unit. The photocrosslinking unit can comprise from 30-90 and preferably from 30-70 mole percent (based on the total acid units of the polyester), the hydrophobic unit can comprise from 5–50 percent, and the ionic unit can comprise from 5–40 mole percent. The photocrosslinking group optionally is either part of the polymer backbone or pendent therefrom.

In general, polyester-ionomers are described in U.S. Pat. No. 3,929,489 by Arcesi and Rauner issued Dec. 30, 1975, and British Pat. No. 1,470,059 by Wagner et al published Apr. 14, 1977. These polyester-ionomers are copolyesters formed by condensing one or more polyhydric alcohols with at least two carboxylic acids and preferably three carboxylic acids, each containing at least two condensation sites. At least one of the carboxylic acids contains at least one site of nonaromatic ethylenic unsaturation, while a remaining carboxylic acid contains a solubilizing sulfonate or iminodisulfonyl substituent. As employed herein, the term "nonaromatic ethylenic unsaturation" is inclusive of carbon-to-carbon double bonding in both aliphatic and alicyclic moieties. Further, the imido groups can be used as linking groups rather than ester groups.

Useful photocrosslinking units are described, for example, in U.S. Pat. Nos. 3,030,208 by Schellenberg and Bayer issued Apr. 17, 1972, 3,702,765 by Laakso issued Nov. 14, 1972, 3,622,320 by Allen issued Nov. 23, 1971, 3,674,745 by Philipot et al issued July 4, 1972, and 3,615,434 by McConkey issued Oct. 25, 1971, Canadian Pat. No. 824,096 by Mench et al. issued Sept. 30, 1969, and Belgian Pat. No. 754,892 by Williams issued Oct. 15, 1970. Useful crosslinking units include phenylenediacrylate, cinnamylidenemalonate, cyclohexylenedicarboxylate, cyclohexadienedicarboxylate and 1,2-diphenylcyclopropen-3-ylcarbonylate.

Useful hydrophobic units are optionally derived from many known dicarboxylic acids. Preferred dicarboxylic acids are aromatic dicarboxylic acids such as phthalic acid, isophthalic acid and terephthalic acid. Useful aliphatic dicarboxylic acids include malonic, succinic, glutaric, adipic, pimelic, subaric and other higher homologue dicarboxylic acids. The hydrophobic unit is also optionally derived from high-temperature-resistant dicarboxylates. Useful dicarboxylates include the phenylindans described in U.S. Pat. No. 3,634,089 by Hamb issued Jan. 11, 1972; the spirobiindan dicarboxylates described in U.S. Pat. No. 3,725,070 by Hamb and Wilson issued Apr. 3, 1973; and the like.

Useful ionic units are optionally derived from aromatic dicarboxylic acids or their derivatives which include a disulfonamido group in which the amido nitrogen atom includes, as an additional substituent, a solubilizing cation. Useful ionic units include 3,3'-sodioiminodisulfonyldibenzoate and 5-[N-(4-tolylsulfonyl)-N-potassiosulfamyl-1,3-benzenedicarboxylate]. These aromatic dicarboxylic acids are described, for example, in U.S. Pat. Nos. 3,929,489 by Arcesi and Rauner issued Dec. 30, 1975, and 3,546,180 by Caldwell and Jones issued Dec. 8, 1970.

The above-described dicarboxylic acid units are linked into condensation copolymers by repeating units derived from one or more diols. The diol component is not critical to the dye-impermeable layers of the present invention and is any conventional diol. Specific useful diols include ethylene glycol, diethylene glycol, 1,3-propanediol, 1,4-butanediol, neopentyl glycol, 1,4-cyclohexanedimethanol and the like. Optionally, more than one diol is used.

Particularly preferred polyester-ionomers for the dye-impermeable polymer in the present invention include the polymers listed below. According to convention, the glycol portion of the polyester is listed first with the molar percentage of the respective glycol components listed in brackets and then the dicarboxylic acid portion of the polyester with its mole percentage listed in brackets.

poly[ethylene-co-1,4-cyclohexylenedimethylene(70:30)-1,1,3-trimethyl-3-phenyl-5,4'-indandicarboxylate-co-3,3'-(1,4-phenylene)diacrylate-co-3,3'-sodioiminodisulfonyldibenzoate(45:50:5)]

poly[ethylene-co-1,4-cyclohexylenedimethylene(70:30)-1,1,3-trimethyl-3-phenyl-5,4'-indandicarboxylate-co-3,3'-(1,4-phenylene)diacrylate-co-5-(4-sodiosulfophenoxy)-1,3-benzenedicarboxylate(45:50:5)]

poly[1,4-cyclohexylenebis(oxyethylene)-co-3,3'-(1,4-phenylene)diacrylate-co-3,3'-sodioiminodisulfonyldibenzoate(95:5)]

The individual filter elements of the color filter array according to the present invention are made by what will be called the "wash-off" method. In this method, a layer of a photosensitive dyeable composition is coated on the surface of the solid-state imaging device. This photosensitive dyeable composition is then exposed so as to crosslink, harden or otherwise render insoluble those areas which will become filter elements. The layer is then developed with a suitable solvent so as to remove those portions which have not been rendered insoluble. This leaves behind a set of dyeable islands which will become the individual filter elements. These dyeable islands are then contacted with a solution containing a dye such as by immersing the device in the dye solution, spraying the device with the solution and the like. Because the islands are formed only on the solid-state radiation-sensitive elements, the bonding pad areas will be substantially free from the dyeable composition.

One dyeable wash-off composition is known in the art as dichromated gelatin. Dichromated gelatin refers to gelatin or a gelatin substitute which has been sensitized with a dichromate salt. Gelatin substitutes include albumin, casein, gum arabic, poly(vinyl alcohol) and the like. The dichromate salt is, for example, potassium, sodium or ammonium dichromate. Dichromated gelatin has sufficient resolution for the filter elements of the color filter arrays for solid-state imaging devices. It adheres well to the photosensitive surface of the solid-state imaging device and is conveniently coated and developed using water solutions. For a fuller description of the use of dichromated gelatin as the radiation-sensitive dyeable wash-off composition, reference is made to U.S. Pat. Nos. 3,284,208 by Land issued Nov. 8, 1966, 3,730,725 by Idelson issued May 1, 1973, and 3,925,082 by Fielding et al. issued Dec. 9, 1975, and Chapter 13 of *History of Color Photography*, referenced above in relation to the prior art.

A preferred photosensitive wash-off dyeable composition comprises a diazo resin. One particularly suitable diazo resin composition is the composition described in CONTINUOUS-TONE DYED DIAZO IMAGING ELEMENTS, cited above in the summary. These compositions include a water-soluble light-sensitive diazo resin and a mordant for an anionic dye. The mordant is selected so as to be compatible with the resin and capable of being retained in the photohardened form of the composition. Individual filter elements of the color filter array of the present invention are made by imagewise-exposing a layer of the diazo composition, developing the layer by rinsing it with water, forming islands of the mordant composition, and then adding an anionic dye to the islands where it is immobilized by the mordant.

Many water-soluble, light-sensitive diazo resins are useful. Particularly preferred are low-molecular-weight resins having a repeating unit of the formula:

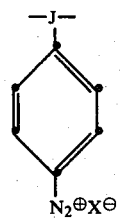

wherein:

J represents the atoms necessary to form a recurring unit in a polymer backbone which optionally includes a suitable linking group such as an imino, ester carbamoyl group and the like and $X^\ominus$ is an anion such as a halide, sulfate or the like.

Particularly preferred resins are acid condensation products of a diazonium salt of p-aminodiphenylamine, such as diphenylamine-4-diazonium halide or diphenylamine-4-diazonium phosphate, condensed in acid with aldehydes such as paraformaldehyde or formaldehyde, and converted to a double metal salt, such as chlorozincate or fluoroborate. These resins are well-known in the art and are described, for example, by Kosar, *Light-Sensitive Systems*, pages 323–324, John Wily and Sons, NY, NY (1965), and in U.S. Pat. No. 3,235,384.

The diazo resin is mixed with a compatible mordant for an anionic dye to produce the photosensitive dyeable wash-off composition which is useful for the filter elements according to the present invention. The term "compatible mordant" refers to a mordant which does not interfere with the normal photohardening capability of diazo resin, whether it be interference with the solution properties necessary for coating, the adhesion properties of the photohardened resin, the photohardening process itself, or any other property of the resin relating to photohardening. The mordant must be one which is capable of being retained in the photohardened form of the composition, in addition to being compatible as defined above. Useful mordants and their preparation are described in the Research Disclosure cited above and in British Pat. No. 1,261,925 and U.S. Pat. Nos. 3,488,706, 3,557,066, 3,625,694, 3,709,690, 3,770,439, 3,758,445, 3,773,509, 3,859,096, 3,898,088, 3,944,424 and 3,958,995.

Particularly preferred mordants are vinylbenzyl quaternary ammonium polymeric mordants which comprise a repeating unit which conforms to the structure:

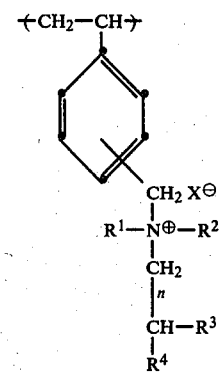

wherein:

$R^1$ and $R^2$ are the same or different and are aryl, aralkyl or alkaryl having from 6 to about 20 carbon atoms or an alkyl group having from 1 to about 10 carbon atoms;

$R^3$ and $R^4$ are either both hydrogen or, together with the carbon atom to which they are attached, form a saturated, unsaturated or aromatic ring or ring system containing from 5 to 10 carbon atoms such as cyclohexyl, cyclopentyl, phenyl and naphthyl;

$X^-$ is an anion such as halide, e.g. chloride, methosulfate, p-toluenesulfonate and the like; and n is 0, 1 or 2. The remainder of the polymeric mordant, where the mordant is a copolymer, is not critical. Many groups such as styrene and the like are useful. The quaternary ammonium-containing unit usually comprises between 10 and 100, preferably 40 to 100 mole percent of the polymeric mordant. Illustrative mordants from this preferred group include:

poly(N-vinylbenzyl-N,N-dimethyl-N-cyclohexylammonium chloride)

poly(N-vinylbenzyl-N-benzyl-N,N-dimethylammonium chloride)

The relative amounts of mordant and diazo resin depend on the molecular weight and the mordanting strength of the mordant, the particular dyes to be used to make the color filter elements of the color filter array, and other factors. A preferred range of diazo resin is from about 0.16 to about 1.0 mg/dm² of coating, and a preferred range of mordant is from about 0.5 to about 15.0 mg/dm². In making color filter arrays or solid-state imaging devices, it is most common to coat the diazo resin composition by spin-coating; however, other methods are useful. The resins are sensitive primarily to UV light and are usually processed using water such as by spraying or by immersing the layer in an agitated vessel.

Many anionic dyes are useful to dye the islands of the diazo resin-anionic dye mordant composition. For color filter arrays for solid-state imaging devices, additive dyes, i.e., red, green and blue, are preferred; however, appropriate combinations of cyan, magenta and yellow are also useful. Useful dyes and dye-containing solutions are well-known in the art. Illustrative dyes include Fast Light Red, Alkaline Fast Green available from Eastman Kodak Company, and the blue dye 6-amino-2-(3-carboxy-5-methylsulfonyl-2-thionylazo)-5-hydroxypyridine. The solvent for the dye solution is most desirably water. However, any solvent is useful so long as it does not dissolve or otherwise adversely react with either the dyeable composition or the crosslinked dye-impermeable polymer.

In preferred embodiments, the color imaging device further comprises a layer of a crosslinked polymer overcoating the color filter array. The bonding pad areas should be substantially free from this overcoat layer. The overcoat layer protects the color filter array from damage during subsequent fabrication steps and other handling. While any photocrosslinkable polymer is useful in forming the overcoat layer, it is convenient to use a photocrosslinkable, dye-impermeable polymer which is the same as or similar to the polymer used in the barrier layers. The overcoat layer is coated, exposed and developed in a manner similar to the barrier layers.

An example of a portion of a color imaging device according to the present invention and a method of making the color filter array are illustrated schematically in cross-section in FIG. 1. It will be readily appreciated that the Figures are schematic and are not drawn to scale. In the first step, a support 10 is coated with a layer of the photosensitive dyeable wash-off composition 20. In the illustration, the support 10 is a solid-state imaging device. Thus, the support 10 has on its surface radiation-sensitive areas 12, 14 and 16 and bonding pad areas 18. As illustrated in FIG. 1(b), photosensitive dyeable layer 20 is exposed and developed so as to produce dyeable islands 22. Dyeable islands 22 are dyed, for example, by immersion in a dye solution so as to produce dyed islands 22' as shown in FIG. 1(c).

Figure 1D:
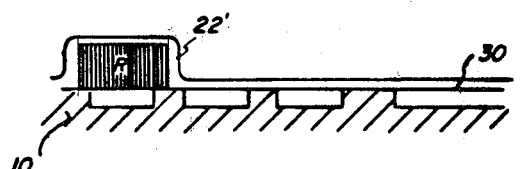
Figure 1E:
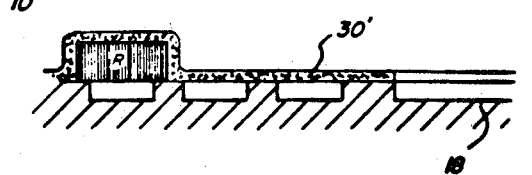
Figure 1F:
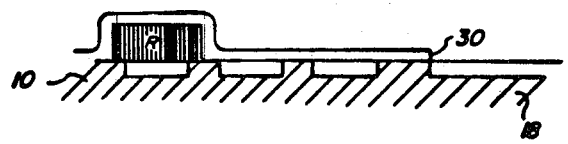

In the next step, shown in FIG. 1(d), the surface of the solid-state imaging device 10 and the dyed islands 22' are coated with a photocrosslinkable, dye-impermeable polymer 30. In FIG. 1(e), the radiation-sensitive dye-impermeable polymer layer 30 is exposed in selected areas so as to crosslink the radiation-sensitive dye-impermeable polymer layer 30. The layer 30 is not exposed in those areas corresponding to bonding pad areas 18. The crosslinked portion of the photocrosslinkable layer 30 is designated 30'. In the next step, as shown in FIG. 1(f), the exposed photocrosslinkable, dye-impermeable polymer layer 30 is developd so as to expose the bonding pad areas 18 on the surface of the radiation-sensitive device 10.

Figure 1G:
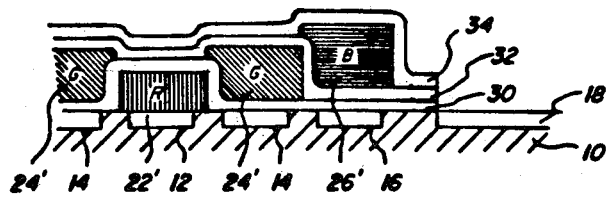
Figure 2A:
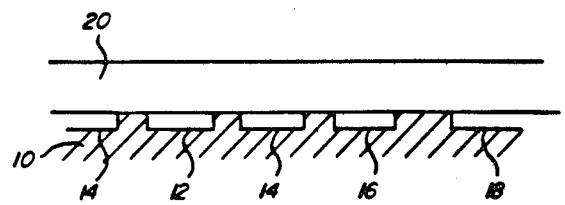
FIGS. 2a–2g are a schematic representation of a device of the present invention, in cross-section, illustrating various stages during an alternate method of preparation.
Figure 2B:
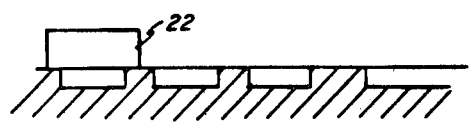
Figure 2C:
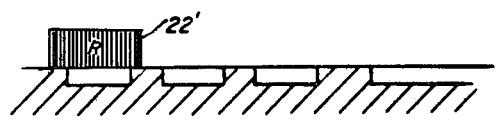
Figure 2D:
Figure 2E:
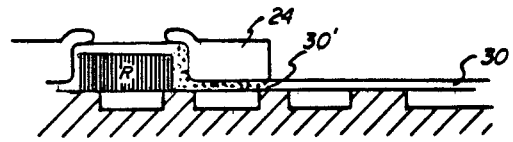
Figure 2F:
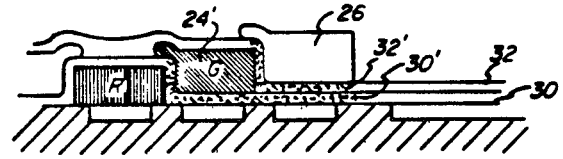
Figure 2G:
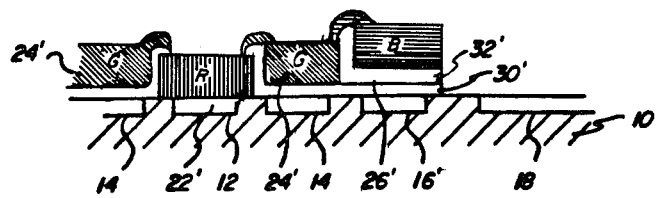

FIG. 1(g) illustrates a portion of a completed solid-state imaging device having a three-color filter array according to the present invention. There is illustrated a solid-state imaging device 10 having radiation-sensitive elements illustrated generally by 12, 14 and 16 and bonding pad areas 18. Superimposed on the radiation-sensitive elements 12, 14 and 16, in microregistration, is a color filter array having three sets of filter elements 22', 24' and 26'. The first set of color filter elements, 22', is directly on the surface of the device 10. The second set of filter elements, 24', is separated from the surface of the device by layer 30. As illustrated, the filter elements 22', 24' and 26' are slightly larger than radiation-sensitive elements 12, 14 and 16 in order to reduce the possibility that nonfiltered light may reach these radiation-sensitive elements. Layer 30 in this embodiment of the process of the invention is a crosslinked, dye-impermeable layer which covers the entire surface of the device 10 except the bonding pad areas 18; that is, it is substantially continuous. A third set of filter elements, 26', is separated from the surface of the device by portions of two layers 30 and 32. In this embodiment, layer 32 is also a substantially continuous layer of a crosslinked, dye-impermeable polymer. Also shown in FIG. 1(g) is an optional overcoat layer 34.

FIG. 2 illustrates an alternate color imaging device and a method of making it according to the present invention. The process proceeds as before up until the device is in the condition illustrated in FIG. 2(d). The results of the next steps are shown in FIG. 2(e). A layer of photosensitive dyeable composition has been coated and developed to produce dyeable island 24. In this embodiment, the photocrosslinkable, dye-impermeable layer was not given a separate exposure but the exposure of the radiation-sensitive dyeable composition 20 was relied upon to crosslink that portion of the photocrosslinkable, dye-impermeable layer 30 which lay between the radiation-sensitive dyeable composition and the surface of the solid-state imaging device. The crosslinked portion of the photocrosslinkable, dye-impermeable layer 30 is designated 30'. The results of the next series of steps are shown in FIG. 2(f). Dyeable islands 24 have been dyed to produce dyed islands 24'. The surface of the solid-state imaging device including the dyed islands has been coated with another layer 32 of photocrosslinkable, dye-impermeable polymer. Another layer of radiation-sensitive dyeable composition has been coated, exposed and developed to produce dyeable islands 26. Exposure of the photosensitive dyeable composition to produce dyeable islands 26 has exposed and crosslinked the portions of layers 32 and 30 which lie between dyeable island 26 and the surface of the solid-state imaging device 10. These portions are designated 30' and 32'. FIG. 2(g) illustrates a portion of a completed device. The dyeable islands 26 have been dyed to produce dyed islands 26'. The device has been rinsed in a solution so as to remove all of the photocrosslinkable, dye-impermeable polymer which was not crosslinked during the formation of islands 24 and 26. The result is a solid-state imaging device having a support 10, having a surface comprising radiation-sensitive elements, generally illustrated as 12, 14 and 16, and bonding pad areas 18. Superimposed on the radiation-sensitive elements 12, 14 and 16, in microregistration, is a color filter array having three sets of filter elements 22', 24' and 26'. Again, the filter elements 22', 24' and 26' are slightly larger than radiation-sensitive elements 12, 14 and 16. The first set of filter elements, 22', is on the surface of the device 10. A second set of filter elements is separated from the surface of the device 10 by a crosslinked dye-impermeable polymer layer indicated by 30'. In this embodiment, only the portion of the layer which is underneath the filter element 24' remains as the remainder of the layer has been washed away; that is, it is a discontinuous layer. A third set of filter elements, 26', is separated from the surface of the device by two layers of crosslinked dye-impermeable polymer indicated by 30' and 32'. Again, only portions of original layers 30 and 32 remain as the remainder has been washed away.

The preferred solid-stage imaging device on which the described color filter arrays are formed comprises an array of charge-handling semiconductive photosensors and bonding pad areas. As is well-known in the art, the surface of the solid-state wafer also contains other areas such as dicing lines along which the wafer can be cut, areas referred to as guard bands, and the like. Examples of charge-handling semiconductive photosensors include, for instance, charge-coupled devices (also known as charge-coupled imagers, charge-transfer devices, charge-transfer imagers and the like), charge-injection devices, bucket-brigade devices, diode arrays, combinations of these and the like. Useful semiconductive wafers having surfaces having photosensitive arrays are described, for example, in U.S. Pat. No. 3,801,884. Devices of this type are commercially available. (In typical devices of this type, the surface is coated with a protective layer of $SiO_2$. For the purpose of the present invention, this structure is equivalent to a structure wherein the radiation-sensitive elements are part of the outermost surface.)

The color filter array is in microregistration with the underlying array of photosensors. As used herein, the term "microregistration" means that the filter array and the photosensor array are precisely aligned on a micron scale. In other words, the position of the filter array is less than about 1 micron away from its intended position with respect to the photosensor array. Further, each filter element is less than about 1 micron away from its intended position in the filter array. A single filter element may be superimposed over one photosensor or a group of photosensors.

The solid-state color imaging device of the present invention takes many forms. Variations in the statistical relationship of the individual color filter elements, the relationship between the number of sensing areas and the number of filter elements, the degree of overlap of the filter elements–to mention but a few–are anticipated. These variations are well-known in the art. Similarly, the environment in which the the solid-state color imaging device is useful iis well-known in the art and need not be discussed in detail. If a more detailed description is desired, reference is made to U.S. Pat. Nos. 3,971,065, 3,982,274, 4,054,906, 4,054,915 and the references cited therein.

The following preparations and examples are presented.

Preparation 1: Diazo resin-anionic dye mordant formulation

A coating composition was prepared which comprised 0.75 g of Fairmont TM diazo resin No 4, Type L, a chlorozincate salt of the condensation product of formaldehyde and p-diazodiphenylamine available from the Fairmont Chemical Company; 0.3 g of an 85% aqueous solution of phosphoric acid stabilizer; 25.0 g of a 10% aqueous solution of poly(n-vinylbenzyl-co-N,N-dimethyl-N-cyclohexylammonium chloride); 0.5 g of a 10% aqueous solution of Olin 10G TM Surfactant, a nonylphenoxypolyglycidol available from Olin Chemical; 1.0 g poly(vinyl pyrrolidone); and 35 mL of distilled water.

Preparation 2: Preparation of a photocrosslinkable dye-impermeable polyester-ionomer A polymer was prepared by a two-stage polyesterification technique. Initially, the following reactants were weighed into a 100-ml round-bottomed polymerization flask:

ethylene glycol, 0.084 mole 1,4-cyclohexanedimethanol, 0.036 mole dimethyl 1,1,3-trimethyl-3-phenyl-5,4'-indandicarboxylate, 0.045 mole diethyl 3,3'-(1,4-phenylene)diacrylate, 0.050 mole dimethyl 3,3'-sodioiminodisulfonyl(dibenzoate), 0.005 mole The flask was flushed with a slow stream of nitrogen for 30 min before it was immersed in a 235° C. salt bath. While still under a nitrogen atmosphere, the reactants were allowed to come to a clear melt before adding 2 drops of the catalyst, tetraisopropyl orthotitanate. After the first stage of the polymerization was completed (about 3 h), the reaction was placed under a 0.2 mm atmosphere with constant stirring. The second stage of the polyesterification is completed when the desired degree of polymerization is attained (approximately 15 min).

The inherent viscosity of the polymer was measured in a 1:1 weight mixture of phenol:chlorobenzene at 25° C. at a concentration of 0.25 g/100 mL of solution. The inherent viscosity was 0.25.

EXAMPLE 1

A color filter array was fabricated on a silicon wafer having a surface (overcoated with a thin layer of $SiO_2$) having photosensitive elements and bonding pad areas according to the following procedure:

Step 1:

The silicon wafer was spin-coated with 5 mL of the diazo resin-mordant formulation of Preparation 1. The wafer was spin-coated at 2200 rpm for 30 sec to produce a 1.2-micron layer of the diazo resin formulation. The wafer was then spin-dried at 4500 rpm for 4 min.

Step 2:

The wafer was exposed to UV light through a mask representing the green set of filter elements for 15 sec on a mask aligner to harden those areas corresponding to the green set of filter elements.

Step 3:

The wafer was rinsed with distilled water at about 25° C. for 20 sec to remove the unhardened materials and to form thereby dyeable islands corresponding to the green set of filter elements.

Step 4:

The wafer was then immersed in an aqueous solution of green anionic dye for 30 sec and then rinsed with distilled water. The wafer ws then spin-dried at 4500 rpm for 4 min.

Step 5:

The wafer was then spin-coated with a solution containing 0.125 g of the polyester-ionomer of Preparation 2. The polymer was dissolved in 5 mL of 1,2-dichloroethane and spin-coated at 2200 rpm for 30 sec to produce a layer having a thickness of about 1500 angstroms. The wafer was then spin-dried at 4500 rpm for 4 min.

Step 6:

The wafer was exposed to UV light for 15 sec through a mask representing the bonding pad areas of the silicon wafer. The mask was a negative mask so that the bonding pad areas remained unexposed.

Step 7:

The layer of the polyester ionomer was developed by rinsing the silicon wafer with 1,2-dichloroethane. The wafer was then spin-dried at high rpm.

Steps 1–7 were repeated except that exposure was through a positive blue mask in Step 2 and a blue dye was used in Step 4.

Steps 1–7 were again repeated except that exposure was through a positive red mask in Step 2 and a red dye was used in Step 4.

The result was a high-quality color filter array in microregistration with the underlying photosensitive areas of the solid-state device.

EXAMPLE 2:

Example 1 was repeated except that the photocrosslinkable, dye-impermeable layer was not separately exposed (Step 6) nor developed (Step 7) during the formation of the three sets of filter elements. Instead, the exposure of the diazo resin (Step 2) was relied on to crosslink any underlying polyester-ionomer resin. After the three sets of color filter element had been formed, the wafer was rinsed with 1,2-dichloroethane to remove the noncrosslinked polyester-ionomer from the bonding pad areas. An overcoat was coated by spin-coating another layer of polyester-ionomer resin as in Step 5. The overcoat was exposed through the bonding pad mask so as to crosslink the overcoat except in those areas corresponding to the bonding pad areas. The wafer was again rinsed with 1,2-dichloroethane to remove the noncrosslinked overcoat from the bonding pad areas.

The invention has been described in detail with particular reference to certain preferred embodiments. It will be understood that variations and modifications are possible within the spirit and scope of the invention.

I claim:

1. A method of making a solid-state color imaging device comprising a support having a surface comprising solid-state radiation-sensitive elements and bonding pad areas and, superimposed on said radiation-sensitive elements, in microregistration, a color filter array having at least three sets of elements, said method comprising the steps of:
    (1) forming a layer of a radiation-sensitive, dyeable composition on said surface;
    (2) exposing and developing said radiation-sensitive dyeable layer so as to form a set of islands superimposed on some of said solid-state radiation-sensitive elements, said islands having an area less than about $1.0 \times 10^{-8}$ m$^2$;
    (3) dyeing said islands formed in step (2) by contacting them with a solution comprising a solvent and a dye, thereby forming a set of filter elements;
    (4) overall coating said dyed islands and the remainder of said surface with a layer of a photocrosslinkable, dye-impermeable polymer;
    (5) exposing said photocrosslinkable, dye-impermeable polymer layer so as to crosslink said polymer at least in those areas corresponding to said islands, leaving unexposed those areas corresponding to said bonding pad areas;
    (6) developing said photocrosslinkable, dye-impermeable polymer layer so as to remove said polymer from said bonding pad areas; and
    (7) repeating steps (1) through (6) and then steps (1) through (3) using a different exposure in each step (2) and a different dye in each step (3) so as to produce second and third sets of filter elements.

2. A method of making a solid-state color imaging device comprising a support having a surface comprising radiation-sensitive elements and bonding pad areas and, superimposed on said radiation-sensitive elements, in microregistration, a color filter array having at least three sets of filter elements, said method comprising the steps of:
    (1) forming a layer of a radiation-sensitive, dyeable composition on said surface;
    (2) exposing and developing said radiation-sensitive dyeable layer so as to form islands superimposed on some of said radiation-sensitive elements, said islands having an area less than about $1.0 \times 10^{-8}$ m$^2$;
    (3) dyeing said islands formed in step (2) by contacting them with a solution comprising a solvent and a dye, thereby forming a set of filter elements;
    (4) overall coating said dyed islands and the remainder of said surface with a layer of a photocrosslinkable, dye-impermeable polymer;
    (5) forming a layer of a radiation-sensitive dyeable composition;
    (6) exposing and developing said radiation-sensitive dyeable layer so as to form islands on some of said radiation-sensitive elements, said islands having an area less than about $1.0 \times 10^{-8}$ m$^2$, said exposure being sufficient to crosslink any photocrosslinkable polymer which underlies said islands;
    (7) dyeing said islands formed in the previous step by contacting them with a solution comprising a solvent and a dye, thereby forming a second set of filter elements;
    (8) repeating steps (4) through (7) so as to produce a third set of filter elements; and
    (9) developing said photocrosslinkable, dye-impermeable polymer so as to remove said polymer in those areas where said polymer was not crosslinked.

3. The method according to either of claims 1 or 2 further comprising the steps of overcoating said device with a layer of a photocrosslinkable polymer, exposing so as to crosslink said layer except in those areas corresponding to said bonding pads, and developing said layer so as to remove said polymer from said bonding pad areas.

4. The method according to either of claims 1 or 2 wherein said crosslinkable, dye-impermeable polymer is a polyester-ionomer.

5. The method according to either of claims 1 or 2 wherein:
    (a) said dyeable composition comprises a water-soluble, light-sensitive diazo resin and a mordant for an anionic dye and
    (b) said crosslinkable, dye-impermeable polymer is a polyester-ionomer comprising, based on the total acid units of the polyester:
        from about 30–90 mole percent of a dicarboxylic acid-derived repeating unit containing nonaromatic ethylenic unsaturation;
        from about 5–50 mole percent of a dicarboxylic acid-derived, hydrophobic repeating unit; and
        from about 5–40 mole percent of a dicarboxylic acid-derived, ionic repeating unit containing an alkali metal sulfonate or a disulfonamido unit containing monovalent cations as amido nitrogen atom substituents.

6. The method according to either of claims 1 or 2 wherein said crosslinkable, dye-impermeable polymer is selected from the group consisting of poly[ethylene-co-1,4-cyclohexylenedimethylene(70:30)-1,1,3-trimethyl-3-phenyl-5,4'-indandicarboxylate-co-3,3'-(1,4-phenylene)-diacrylate-co-3,3'-sodioiminodisulfonyldibenzoate(45:50:5)], poly[ethylene-co-1,4-cyclohexylenedimethylene(70:30)-1,1,3-trimethyl-3-phenyl-5,4'-indandicarboxylate-co-3,3'-(1,4-phenylene)diacrylate-co-5-(4-sodiosulfophenoxy)-1,3-benzenedicarboxylate(45:50:5)], and poly[1,4-cyclohexylenebis(oxyethylene)-co-3,3'-(1,4-phenylene)diacrylate-co-3,3'-sodioiminodisulfonyldibenzoate(95:5)].

* * * * *